(12) United States Patent
Suzuki et al.

(10) Patent No.: US 6,340,505 B1
(45) Date of Patent: Jan. 22, 2002

(54) PROCESS FOR PRODUCING A MAGNETIC RECORDING MEDIUM

(75) Inventors: Mikio Suzuki; Noriyuki Miyamoto; Emi Shimaoka; Kimie Takagi, all of Chiba (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/469,278

(22) Filed: Dec. 22, 1999

Related U.S. Application Data
(60) Provisional application No. 60/137,496, filed on Jun. 4, 1999.

(30) Foreign Application Priority Data

Dec. 22, 1998 (JP) ............................................. 10-365709

(51) Int. Cl.[7] ................................................ H05H 1/02
(52) U.S. Cl. ..................... 427/570; 427/131; 427/249.1; 427/249.7; 427/250; 427/255.28; 427/255.39; 427/255.7; 427/294; 427/404
(58) Field of Search ................................ 427/570, 576, 427/577, 585, 121, 249.7, 249.1, 250, 255.39, 255.7, 255.28, 294, 404

(56) References Cited

U.S. PATENT DOCUMENTS 5,275,850 A * 1/1994 Kitoh et al.

* cited by examiner

Primary Examiner—Bernard Pianalto
(74) Attorney, Agent, or Firm—Sughrue Mion, PLLC

(57) ABSTRACT

A hydrogenated or fluorinated carbon protective film is formed on a disk through a plasma CVD method by use of a hydrocarbon-containing reaction gas as a raw material, where the disk comprises a non-magnetic substrate on which a non-magnetic undercoat film and a magnetic film are successively formed, wherein the protective film has a thickness of 2.2 g/cm$^3$ or more.

10 Claims, 2 Drawing Sheets

PROCESS FOR PRODUCING A MAGNETIC RECORDING MEDIUM

CROSS REFERENCE TO RELATED APPLICATIONS

This application is an application filed under 35 U.S.C. §111(a) claiming benefit pursuant to 35 U.S.C. §119(e)(i) of the filing date of Provisional Application 60/137,496 filed Jun. 4, 1999 pursuant to 35 U.S.C. §111(b).

FIELD OF THE INVENTION

The present invention relates to a magnetic recording medium used in, for example, a magnetic disk apparatus, and to a production process for the medium.

BACKGROUND OF THE INVENTION

A conventionally used magnetic recording medium comprises a non-magnetic substrate on which a non-magnetic undercoat film and a magnetic film are formed, a protective film formed through sputtering on the magnetic film by use of a material such as carbon, and a lubrication film having a thickness of tens of Å, which is formed on the protective film by the application of a lubricant such as perfluoropolyether.

Recently, a magnetic recording medium of high recording density has been demanded, and a magnetic recording medium capable of reducing spacing loss has also been demanded.

However, when the thickness of a protective film and a lubrication film are reduced in order to decrease spacing loss, sliding durability may deteriorate. Therefore, at the present time, a magnetic recording medium having high sliding durability, wherein recording density can be sufficiently increased, is not attained.

SUMMARY OF THE INVENTION

In view of the foregoing, the present invention provides a magnetic recording medium having excellent durability and capable of increased recording density, and a production process for the medium.

The production process for a magnetic recording medium according to the present invention comprises forming a hydrogenated carbon protective film on a disk through a plasma CVD method making use of a reaction gas containing a hydrocarbon serving as a raw material, which disk comprises a non-magnetic substrate on which a non-magnetic undercoat film and a magnetic film are formed, and the protective film has a density of 2.2 $g/cm^3$ or more.

When the hydrogenated carbon protective film is formed, pulse direct-current bias is applied to the disk. The pulse direct-current bias has a mean voltage of −700 to −150 V, preferably −350 to −150 V, and a positive voltage peak value of 10 to 100 V, preferably 20 to 75 V.

In the process, a hydrocarbon source is selected from lower saturated hydrocarbons, lower unsaturated hydrocarbons, and lower cyclic hydrocarbons. Of these, one or more species are preferably used.

The magnetic recording medium according to the present invention comprises a non-magnetic substrate on which a non-magnetic undercoat film and a magnetic film are formed, and a hydrogenated carbon protective film which is formed on the magnetic film through a plasma CVD method making use of a reaction gas containing a hydrocarbon serving as a raw material, wherein the density of the protective film is 2.2 $g/cm^3$ or more.

The hydrogenated carbon protective film may be formed on the outermost surface of the magnetic recording medium.

The production process for a magnetic recording medium according to the present invention comprises forming a fluorinated carbon protective film on a disk through a plasma CVD method making use of a reaction gas containing an organic fluorine compound serving as a raw material, which disk comprises a non-magnetic substrate on which a non-magnetic undercoat film and a magnetic film are formed, and the protective film has a density of 2.0 to 2.6 $g/cm^3$.

When the fluorinated carbon protective film is formed, pulse direct-current bias is imparted to the disk. The pulse direct-current bias has a mean voltage of −400 to −100 V, preferably −350 to −100 V, and a positive voltage peak value of 10 to 100 V, preferably 20 to 75 V.

In the process, a lower saturated organic fluorine compound, a lower unsaturated organic fluorine compound, or both are preferably used as the organic fluorine compound.

The magnetic recording medium according to the present invention comprises a non-magnetic substrate on which a non-magnetic undercoat film and a magnetic film are formed, and a fluorinated carbon protective film which is formed on the magnetic film through a plasma CVD method making use of a reaction gas containing an organic fluorinated compound serving as a raw material, wherein the density of the protective film is 2.0 to 2.6 $g/cm^3$.

The fluorinated carbon protective film may be formed on the outermost surface of the magnetic recording medium.

DESCRIPTION OF THE PREFERRED EMBODIMENTS

Figure 1:
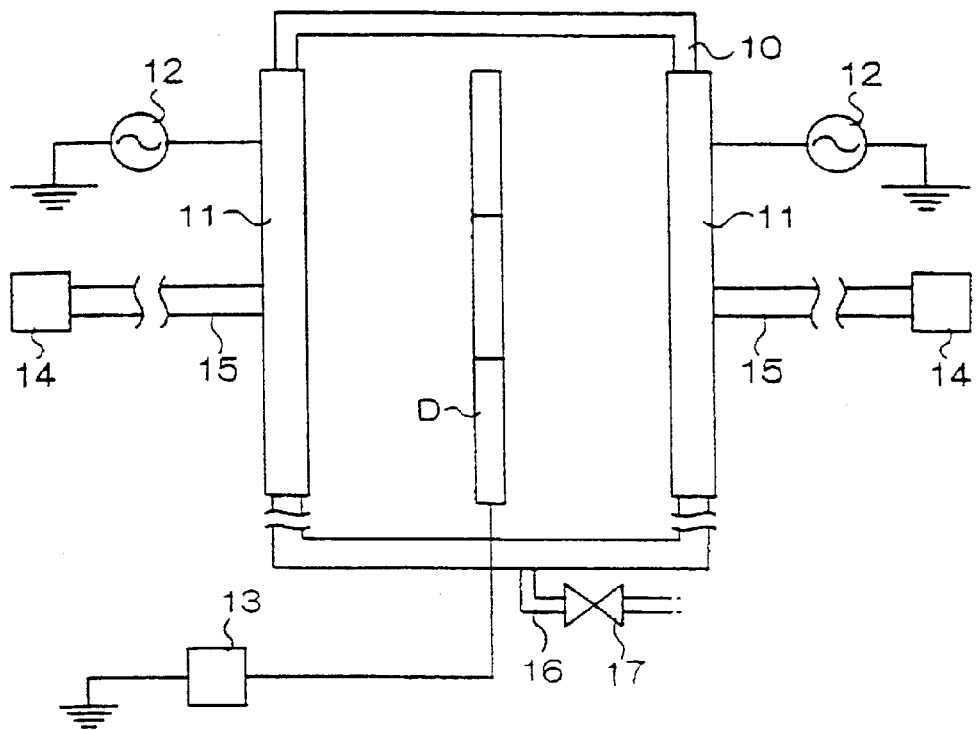
FIG. 1 is a schematic representation showing a plasma CVD apparatus employed for carrying out one mode of the production process of a magnetic recording medium according to the present invention.

FIG. 1 is a schematic representation of a plasma CVD apparatus serving as a main portion of a production apparatus used for carrying out one mode of the production process for a magnetic recording medium according to the present invention. The plasma CVD apparatus comprises a chamber 10 accommodating a disk on which a protective film is formed; electrodes 11, 11 provided on opposing walls in the chamber 10 so as to face each other; high-frequency power sources 12, 12 for supplying high-frequency power to the electrodes 11, 11; a bias power source 13 which may be connected to the disk in the chamber 10; and reaction gas supply sources 14 for supplying a reaction gas serving as a raw material of the protective film, which film is formed on the disk.

The chamber 10 is connected to conduits 15, 15 for feeding reaction gas from the sources 14 into the chamber 10, and an exhaust pipe 16 for discharging gas from the chamber 10. The exhaust pipe 16 has a discharge amount control valve 17, which may control the discharge amount to thereby arbitrarily set the pressure in the chamber 10.

Preferred examples of the high-frequency power sources 12 include a power source which can supply 50 to 2,000 W of power to the electrodes 11 during formation of the hydrogenated carbon protective film.

A pulse direct-current power source or a high-frequency power source may be used for the bias power source 13.

One mode of the production process for a magnetic recording medium according to the present invention will next be described, taking the above-described apparatus as an example.

Firstly, by use of a technique such as sputtering, a non-magnetic undercoat film and a magnetic film are successively formed on each surface of a non-magnetic substrate, to thereby obtain a disk D.

The non-magnetic substrate may be one that is generally used as a substrate for a magnetic recording medium, and examples thereof include an aluminum alloy substrate having a NiP-plating film, and a glass or a silicon substrate. The surface of the non-magnetic substrate is preferably subjected to texture processing such as mechanical texture processing, and more preferably the substrate has a mean surface roughness (Ra) of 1 to 20 Å.

Preferred examples of the material of the non-magnetic undercoat film include Cr and Cr alloys such as Cr/Ti, Cr/W, Cr/V, and Cr/Si.

Preferred examples of the material of the magnetic film include Co alloys such as Co/Cr, Co/Cr/Ta, Co/Cr/Pt, and Co/Cr/Pt/Ta.

The thicknesses of the non-magnetic undercoat film and the magnetic film are preferably 50 to 1,000 Å and 50 to 800 Å, respectively.

Subsequently, the disk D is conveyed in the chamber 10 of the plasma CVD apparatus. Meanwhile, the reaction gas supplied from the sources 14 is fed through the conduits 15 into the chamber 10, and the existing gas in the chamber 10 is discharged through the exhaust pipe 16. Thus, the process gas flows throughout the chamber 10, and the surfaces of the disk D are exposed to the gas.

In the process, a hydrocarbon-containing gas; for example, a gas comprising a mixed gas of hydrogen and hydrocarbon as a primary component, may be used as a reaction gas.

In the above mixed gas, the volume ratio of hydrocarbon to hydrogen is preferably 2:1 to 1:100.

As used herein, the term "primary component" refers to a component that is used in an amount of 90 vol % or more.

Examples of the above-described hydrocarbon include lower saturated hydrocarbons, lower unsaturated hydrocarbons, and lower cyclic hydrocarbons. Of these, one or more species are preferably used.

Examples of lower saturated hydrocarbons include methane, ethane, propane, butane, and octane. Examples of lower unsaturated hydrocarbons include isopropylene, ethylene, propylene, butylene, and butadiene. Examples of lower cyclic hydrocarbons include benzene, toluene, xylene, styrene, naphthalene, cyclohexane, and cyclohexadiene.

As used herein, the term "lower hydrocarbon" refers to a $C_1$–$C_{10}$ hydrocarbon.

A lower hydrocarbon is preferably used as a hydrocarbon, for the reasons described below. When the number of carbons in the hydrocarbon is in excess of the upper limit of the above-described range, the compound becomes difficult to feed in the form of gas, and the hydrocarbon hardly decomposes during discharge, to thereby produce a hydrogenated carbon protective film containing a large amount of polymer components and having poor strength.

In the production process, the pressure in the chamber 10 is preferably adjusted to fall within a range of 0.1 to 10 Pa, by arbitrarily controlling the gas discharge rate from the chamber 10 by use of the discharge amount control valve 17. In addition, the flow rate of the reaction gas is preferably 50 to 500 sccm.

Simultaneously, a high-frequency power, preferably 50 to 2,000 W, is supplied to the electrodes 11 by use of the high-frequency power sources 12, to thereby generate a plasma in the chamber. A hydrogenated carbon protective film is formed on each surface of the disk D through plasma chemical vapor deposition making use of the above-described reaction gas serving as a raw material.

The thickness of the hydrogenated carbon protective film is 30 to 100 Å, preferably 30 to 75 Å.

When power is supplied to the electrodes 11, 11, the phases of power supplied to the electrodes 11, 11 are preferably shifted from each other. This is because the rate of film formation and durability of the protective film may be improved by the phase shift. The difference between the phases is preferably 90 to 270°, more preferably 180° (opposite phase).

When the hydrogenated carbon protective film is formed, pulse direct-current bias is preferably imparted to the disk D by use of the bias power source 13.

The pulse direct-current bias imparted to the disk D has a mean voltage of −700 to −150 V, preferably −350 to −150 V.

When the mean voltage is below the lower limit of the above range, plasma impacts against the surface of disk D very strongly to thereby hinder the activated species of the reaction gas excited by plasma from depositing on the disk D. As a result, the protective film tends to have insufficient density and poor sliding durability.

In contrast, when the mean voltage is in excess of the upper limit of the above range, plasma impacts against the surface of disk D very weakly, and the protective film tends to have insufficient density and poor sliding durability.

The pulse direct-current bias has a positive voltage peak value; i.e., a peak value in a positive region of a pulse portion, of 10 to 100 V, preferably 20 to 75 V.

When the peak value is below the lower limit of the above range, a positive bias voltage cannot sufficiently cancel negative charges accumulated on the surface of the disk D, and deposition of the activated species on the disk D is hindered. As a result, the protective film tends to have insufficient density and poor sliding durability.

In contrast, when the peak value is in excess of the upper limit of the above range, reverse-sputtering tends to occur on the disk D and the protective film tends to have insufficient density and poor sliding durability.

Thus, when the mean voltage of the pulse direct-current bias falls within the above range, the plasma sufficiently impacts against the surface of disk D. In addition, when the positive voltage peak value falls within the above range, a positive bias voltage can cancel negative charges accumulated on the surface of the disk D, and can promote the deposition of the activated species on the disk D. As a result, the protective film becomes dense and improves in sliding durability.

The above-described direct-current bias has a frequency of 1 kHz to 100 GHz, preferably 10 kHz to 1 GHz.

When the frequency is below the lower limit of the above range, a positive bias voltage cannot sufficiently cancel negative charges accumulated on the surface of the disk D, and deposition of the activated species on the disk D is hindered. As a result, the protective film tends to have insufficient density. In contrast, when the frequency is in excess of the upper limit of the above range, reverse-sputtering tends to occur on the surface of the disk D and the protective film tends to have insufficient density.

The above-described direct-current bias has a pulse width of 1 ns to 500 μs, preferably 10 ns to 50 μs.

When the pulse width is below the lower limit of the above range, a positive bias voltage cannot sufficiently cancel negative charges accumulated on the surface of the disk D, and deposition of the activated species on the disk D is hindered. As a result, the protective film tends to have insufficient density. In contrast, when the pulse width is in excess of the upper limit of the above range, reverse-sputtering tends to occur on the surface of the disk D and the protective film tends to have insufficient density.

Figure 2:
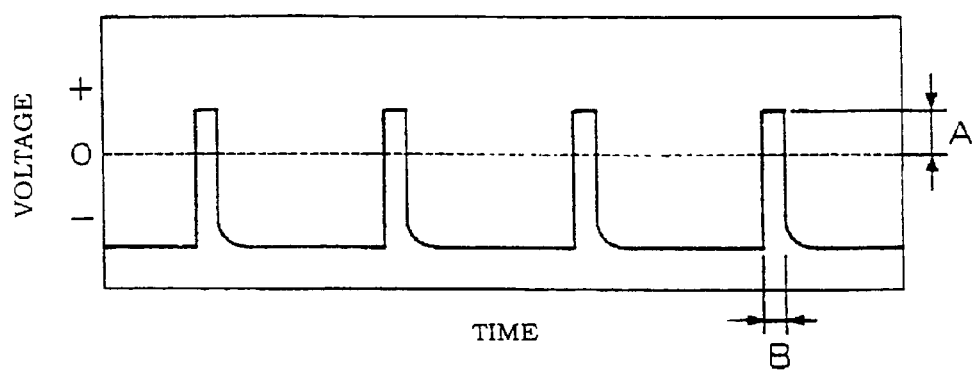
FIG. 2 is a graph explaining a positive voltage peak value of pulse direct-current bias.

As used herein, the term "positive voltage peak value of pulse direct-current bias" refers to, for example, a peak value A in a positive region in a pulse portion of a voltage waveform of a pulse direct-current bias shown by a solid line in FIG. 2. In this case, a pulse width refers to a width B in the pulse portion.

When the protective film is formed, a high-frequency power source may be used as the bias power source 13, and instead of pulse direct-current bias, high-frequency bias may be imparted to the disk. In this case, the high-frequency power imparted to the disk D is 10 to 300 W, preferably 10 to 150 W.

In the process, bias may be imparted to the disk D directly or via an unillustrated disk carrier.

The hydrogenated carbon protective film formed through the process as above-described has a density of 2.2 g/cm$^3$ or more (e.g., 2.2 to 2.85 g/cm$^3$), preferably 2.2 to 2.6 g/cm$^3$, more preferably 2.2 to 2.58 g/cm$^3$.

The hydrogenated carbon protective film having the above-described density has high mechanical strength and excellent sliding durability.

The density of the hydrogenated carbon protective film falls within the above range, for the reasons described below. When the density is below the lower limit of the above range, the formed protective film exhibits low durability, and the produced magnetic recording medium has insufficient durability.

Figure 3:
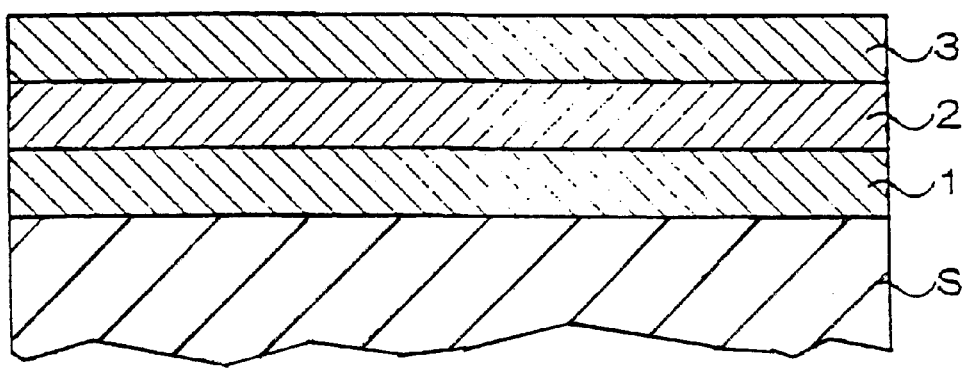
FIG. 3 is a partial sectional view of an embodiment of a magnetic recording medium according to the present invention.

One embodiment of the magnetic recording medium produced through the above-described production process is shown in FIG. 3.

The magnetic recording medium of the mode comprises a non-magnetic substrate S, a non-magnetic undercoat film 1, a magnetic film 2, and a hydrogenated carbon protective film 3, which films are successively formed on the substrate.

The magnetic recording medium comprises no lubrication film, and comprises the hydrogenated carbon protective film 3 having a density within the above range, which is formed as the outermost film.

In the production process for the magnetic recording medium according to the mode, the hydrogenated carbon protective film is formed through a plasma CVD method. The thus-formed hydrogenated carbon protective film has a density of 2.2 g/cm$^3$ or more, and exhibits excellent sliding durability and lubricity.

Thus, the magnetic recording medium enables elimination of a lubrication film which is contained in a conventional magnetic recording medium. In addition, the thickness of the protective film can be reduced to thereby produce the magnetic recording medium capable of reducing spacing loss.

Therefore, the production process produces the magnetic recording medium having excellent durability, wherein recording density can be sufficiently increased.

In addition, the magnetic recording medium enables elimination of a lubrication film, and therefore the step for formation of lubrication film can be omitted in the production process. As a result, the production process can be simplified to thereby improve production efficiency and reduce production cost.

In the production process for a magnetic recording medium according to the present invention, a protective film may be formed by use of a reaction gas containing as a primary component an organic fluorine compound; for example, the following organic fluorine compounds.

In the process, a lower saturated organic fluorine compound, a lower unsaturated organic fluorine compound, or both may be used.

Examples of lower saturated organic fluorine compounds which may be used include tetrafluoromethane ($CF_4$), perfluoropropane ($C_3F_8$), trifluoromethane ($CHF_3$), and hexafluoroethane ($C_2F_6$).

Examples of lower unsaturated organic fluorine compounds which may be used include hexafluoropropene ($C_3F_6$) and hexafluoro-2-butyne ($C_4F_6$).

A lower organic fluorine compound is preferably used as an organic fluorine compound, for the reasons described below. When the number of carbons in the organic fluorine compound is in excess of the upper limit of the above-described range ($C_{10}$), the compound becomes difficult to feed in the form of a gas, and the organic fluorine compound hardly decomposes during discharge, to thereby produce a fluorinated carbon protective film containing a large amount of polymer components and having poor strength.

A protective film formed by use of an organic fluorine compound serving as a reaction gas becomes a fluorinated carbon protective film containing fluorine.

The thickness of the fluorinated carbon protective film is 30 to 100 Å, preferably 30 to 75 'Å.

When the fluorinated carbon protective film is formed, pulse direct-current bias is preferably imparted to the disk D by use of the bias power source 13.

The pulse direct-current bias imparted to the disk D has a mean voltage of −400 to −100 V, preferably −350 to −100 V.

When the mean voltage is below the lower limit of the above range, plasma impacts against the surface of disk D very strongly to thereby hinder the activated species from depositing on the disk D. As a result, the protective film tends to have insufficient density and poor sliding durability.

In contrast, when the mean voltage is in excess of the upper limit of the above range, plasma impacts against the surface of disk D very weakly, and the protective film tends to have insufficient density and poor sliding durability.

The pulse direct-current bias has a positive voltage peak value of 10 to 100 V, preferably 20 to 75 V.

When the peak value is below the lower limit of the above range, a positive bias voltage cannot sufficiently cancel negative charges accumulated on the surface of the disk D, and deposition of the activated species on the disk D is hindered. As a result, the protective film tends to have insufficient density and poor sliding durability.

In contrast, when the peak value is in excess of the upper limit of the above range, reverse-sputtering tends to occur on the surface of disk D and the protective film tends to have insufficient density and poor sliding durability.

The frequency and the pulse width of the above-described pulse direct-current bias may be set to the above-described range.

When the protective film is formed, a high-frequency power source may be used as the bias power source 13, and instead of pulse direct-current bias, high-frequency bias may be imparted to the disk D. For example, a high-frequency bias of 10 to 300 W may be imparted to the disk D.

The fluorinated carbon protective film formed through the above-described production process has a density of 2.0 to 2.6 g/cm$^3$, preferably 2.0 to 2.3 g/cm$^3$, more preferably 2.0 to 2.27 g/cm$^3$.

The fluorinated carbon protective film having the above-described density has high mechanical strength and excellent sliding durability.

The density of the fluorinated carbon protective film falls within the above range, for the reasons described below. When the density is below the lower limit of the above range or in excess of the upper limit of the above range, the protective film exhibits low durability and the produced magnetic recording medium has insufficient durability.

In addition, the fluorinated carbon protective film has a density of more than 2.0 g/cm$^3$ and not more than 2.6 g/cm$^3$, preferably more than 2.0 g/cm$^3$ and not more than 2.3 g/cm$^3$, more preferably more than 2.0 g/cm$^3$ and not more than 2.27 g/cm$^3$.

FIG. 3 is a schematic representation showing an embodiment of the magnetic recording medium produced through the above-described production process by use of an organic fluorine compound. The magnetic recording medium of the embodiment comprises a non-magnetic substrate S on which a non-magnetic undercoat film 1 and a magnetic film 2 are formed, and a fluorinated carbon protective film 3 having a density within the above range serving as the outermost film.

In the production process for the magnetic recording medium according to the mode, the fluorinated carbon protective has a density of 2.0 to 2.6 g/cm$^3$, and exhibits excellent sliding durability and lubricity, and thus the magnetic recording medium enables elimination of a lubrication film. In addition, the thickness of the protective film can be reduced to thereby produce the magnetic recording medium capable of reducing spacing loss.

Therefore, the production process produces a magnetic recording medium having excellent durability, wherein recording density can be sufficiently increased.

In addition, the production process may improve production efficiency and reduce production cost.

EXAMPLES

The following examples are given to further illustrate the present invention. Unless otherwise indicated, all parts, percents, ratios and the like are by weight.

Test Examples 1 to 9

An NiP-plated aluminum alloy substrate (diameter: 95 mm, thickness: 0.8 mm) was subjected to mechanical texture processing, so as to obtain a mean surface roughness (Ra) of 10 Å. A non-magnetic undercoat film containing a Cr alloy and a magnetic film containing a Co alloy were successively formed on each surface of the above-obtained substrate by use of a DC magnetron sputtering apparatus (Model 3010, product of ANELVA Corporation), to thereby obtain a disk D.

Subsequently, a carbon protective film was formed on the disk D by use of the plasma CVD apparatus shown in FIG. 1. The apparatus comprises the bias power source 13 serving as a pulse direct-current power source.

The disk D was conveyed into the chamber 10 of the plasma CVD apparatus, and a reaction gas was supplied into the chamber 10 from the sources 14.

As is shown in Table 1, a mixed gas of hydrocarbon and hydrogen was used as the reaction gas.

Simultaneously, a high-frequency power of 800 W (frequency: 13.56 MHz) was supplied to the electrodes 11, so as to generate plasma, and a hydrogenated carbon protective film having a thickness of 50 Å was formed on each surface of the disk D, to thereby produce a magnetic recording medium as shown in FIG. 3. The magnetic recording medium comprises the substrate S on which the non-magnetic undercoat film 1 and the magnetic film 2 are formed, and the hydrogenated carbon protective film 3 serving as the outermost film.

When the protective film was formed, pulse direct-current bias was imparted to the disk D by use of the bias power source 13.

Table 1 shows the types of the reaction gas, the respective flow rates, and the mean voltage and the positive voltage peak value of the pulse direct-current bias imparted to the disk D from the bias power source 13.

The frequency and the pulse width of the pulse direct-current bias were 200 kHz and 500 ns, respectively.

During formation of the protective film, the temperature of the disk D and the rate of film formation were 170° C. and 370 Å/minute, respectively. The distance between the electrode 11 and the disk D was 30 mm, and the pressure of the reaction gas in the chamber 10 was 4 Pa.

The carbon protective film in each magnetic recording medium of Test Examples 1 to 9 was subjected to measurement of density, and the results are shown in Table 1. The density was calculated by use of the density of particles obtained through Rutherford back-scattering analysis and film thickness obtained through cross section TEM.

The carbon protective film of the magnetic recording medium was also subjected to hardness measurement, and the results are shown in Table 1. The hardness was measured by use of a force/displacement transducer (product of HYSITRON).

The magnetic recording medium in each of Test Examples 1 to 9 was subjected to the CSS test as described below.

In the CSS test, the magnetic recording medium was subjected to 20,000 cycles of CSS operation by use of an MR head at a rotation rate of 7,200 rpm at 40° C. and 80% humidity. Thereafter, the medium was allowed to stand for one hour, and a dynamic stiction value was measured by use of a CSS tester.

The above CSS operation was carried out according to a cycle of rising for five seconds, high-speed operation for one second (sliding operation at the above rotation rate), falling for five seconds, and parking for one second.

The results of the CSS test are shown in Table 1. In Table 1, the term "Crash" refers to the case where a head crash occurred during 20,000 cycles of CSS operation in the CSS test.

Test Examples 10 to 14

The procedure of the above-described test examples was repeated, except that an organic fluorine compound shown in Table 1 was used as a reaction gas, to thereby produce a magnetic recording medium having a structure similar to that of the medium shown in FIG. 3. The thus-produced magnetic recording medium was subjected to the above-described CSS testing. The results are shown in Table 1.

During formation of the protective film, the temperature of the disk D and the rate of film formation were 170° C. and 250 Å/minute, respectively.

Test Examples 15 to 17

The procedure of the above-described test examples was repeated, except that a protective film was formed through sputtering, to thereby produce a magnetic recording medium. The thus-produced magnetic recording medium was subjected to CSS testing. The results are shown in Table 1.

In Test Example 15, a protective film containing only carbon was formed. In Test Example 16, nitrogen-containing gas was used for sputtering, to thereby form a protective film containing nitrogen in an amount of 5 at %. In Test Example 17, hydrogen-containing gas was used for sputtering, to thereby form a protective film containing hydrogen in an amount of 10 at %.

Particularly, the magnetic recording medium comprising the protective film having a density of 2.0 to 2.3 g/cm$^3$ has a low stiction value and exhibits excellent sliding durability.

In contrast, the magnetic recording medium comprising the protective film having a density of less than 2.0 g/cm$^3$ or in excess of 2.6 g/cm$^3$ exhibits poor sliding durability, for the reason described below. When the density of the protective film is in excess of 2.6 g/cm$^3$, high fluorine content in the protective film may lower the hardness of the film.

As a result of comparison between the magnetic recording medium comprising the fluorinated carbon protective film and the magnetic recording medium comprising the hydrogenated carbon protective film, the former medium was found to have a lower ratio of stiction value to density of the protective film. As is apparent from this fact, when the densities of the protective films in these two types of magnetic recording medium are the same, the magnetic recording medium comprising the fluorinated carbon protective film exhibits more excellent sliding durability.

As is described above, according to the present invention, a protective film having excellent sliding durability and lubricity can be formed, and thus a magnetic recording

TABLE 1

| | Reaction gas | | | Bias | | | | |
| --- | --- | --- | --- | --- | --- | --- | --- | --- |
| | Hydrocarbon or Organic Fluorine Compound | | Hydrogen | Mean | Positive Voltage Peak | | | |
| | Type | Flow rate (sccm) | Flow rate (sccm) | Voltage (V) | Value (V) | Density (g/cm$^3$) | Hardness (Gpa) | Stiction (—) |
| Test Ex. 1 | Isoprene | 44 | 143 | −60 | 75 | 1.88 | 19.73 | Crash |
| Test Ex. 2 | Isoprene | 44 | 143 | −150 | 75 | 2.24 | 27.11 | 1.06 |
| Test Ex. 3 | Isoprene | 44 | 143 | −320 | 75 | 2.38 | 28.03 | 1.10 |
| Test Ex. 4 | Isoprene | 44 | 143 | −320 | 50 | 2.56 | 29.66 | 0.83 |
| Test Ex. 5 | Isoprene | 44 | 143 | −500 | 50 | 2.83 | 34.09 | 2.20 |
| Test Ex. 6 | Butadiene | 44 | 143 | −120 | 75 | 2.07 | 20.29 | Crash |
| Test Ex. 7 | Butadiene | 44 | 143 | −150 | 50 | 2.20 | 27.03 | 0.99 |
| Test Ex. 8 | Butadiene | 44 | 143 | −320 | 75 | 2.41 | 28.35 | 1.02 |
| Test Ex. 9 | Butadiene | 44 | 143 | −320 | 50 | 2.58 | 30.02 | 0.89 |
| Test Ex. 10 | CF$_4$ | 50 | 0 | −60 | 75 | 1.88 | 18.21 | Crash |
| Test Ex. 11 | CF$_4$ | 50 | 0 | −120 | 75 | 2.00 | 22.79 | 0.87 |
| Test Ex. 12 | CF$_4$ | 50 | 0 | −320 | 75 | 2.27 | 24.07 | 0.77 |
| Test Ex. 13 | CF$_4$ | 50 | 0 | −320 | 50 | 2.58 | 25.38 | 1.03 |
| Test Ex. 14 | CF$_4$ | 50 | 0 | −500 | 50 | 2.64 | 20.33 | Crash |
| Test Ex. 15 | — | — | — | — | — | 1.71 | 16.83 | Crash |
| Test Ex. 16 | — | — | — | — | — | 1.93 | 18.02 | Crash |
| Test Ex. 17 | — | — | — | — | — | 2.05 | 20.18 | 5.27 |

(In Table 1, "butadiene" refers to 1,3-butadiene.)

As is apparent from the results of the CSS test in Table 1, the magnetic recording medium comprising the hydrogenated carbon protective film, the film being formed of a mixed gas of hydrocarbon and hydrogen serving as a reaction gas and the density of the film being 2.2 g/cm$^3$ or more, exhibits excellent sliding durability even though no lubrication film is present.

Particularly, the magnetic recording medium comprising the protective film having a density of 2.2 to 2.6 g/cm$^3$ has a low stiction value and exhibits excellent sliding durability.

In contrast, the magnetic recording medium comprising the protective film having a density of less than 2.2 g/cm$^3$ exhibits poor sliding durability.

As is also apparent from the results in Table 1, the magnetic recording medium comprising the fluorinated carbon protective film, the film being formed of an organic fluorine compound serving as a reaction gas and the density of the film being 2.0 to 2.6 g/cm$^3$ or more, exhibits excellent sliding durability despite having no lubrication film.

medium without a lubrication film is possible. In addition, the thickness of the protective film can be reduced to thereby produce a magnetic recording medium capable of reducing spacing loss.

Therefore, the present invention provides a magnetic recording medium having excellent durability and capable of sufficiently increasing recording density.

In addition, the present invention provides improved production efficiency and reduced production cost.

While the invention has been described in detail and with reference to specific embodiments thereof, it will be apparent to one skilled in the art that various changes and modifications can be made therein without departing from the spirit and scope thereof.

What is claimed is:

1. A process for producing a magnetic recording medium comprising forming a hydrogenated carbon protective film on a disk through a plasma CVD method using a reaction gas containing a hydrocarbon serving as a raw material, wherein during the forming of the carbon protective film, the process includes supplying a high-frequency power of 50 to 2000 W to electrodes and applying a pulse direct-current bias to the disk with the pulse direct-current bias having a mean voltage of −700 to −150 V and a positive voltage peak value of 10 to 100 V, wherein the disk comprises a non-magnetic substrate on which a non-magnetic undercoat film and a magnetic film are formed, wherein the formed protective film has a density of 2.2 g/cm$^3$ or more.

2. A process for producing a magnetic recording medium according to claim 1, wherein the hydrocarbon source is one or more species selected from the group consisting of lower saturated hydrocarbons, lower unsaturated hydrocarbons, and lower cyclic hydrocarbons.

3. A process for producing a magnetic recording medium according to claim 1 or 2, wherein the phases of power supplied to the electrodes are shifted from each other.

4. A process for producing a magnetic recording medium according to claim 1 or 2, wherein the direct-current bias has a frequency of 1 kHz to 100 GHz.

5. A process for producing a magnetic recording medium according to claim 1 or 2, wherein the direct-current bias has a pulse width of 1 ns to 500 μs.

6. A process for producing a magnetic recording medium which comprises forming a fluorinated carbon protective film on a disk through a plasma CVD method using a reaction gas containing an organic fluorine compound as a raw material, wherein during the forming of the carbon protective film, the process includes supplying a high-frequency power of 50 to 2000 W to electrodes and applying a pulse direct-current bias to the disk with the pulse direct-current bias having a mean voltage of −400 to −100 V and a positive voltage peak value of 10 to 100 V, wherein the disk comprises a non-magnetic substrate on which a non-magnetic undercoat film and a magnetic film are formed, and the protective film having a density of 2.0 to 2.6 g/cm$^3$.

7. A process for producing a magnetic recording medium according to claim 6, wherein the organic fluorine compound is a lower saturated organic fluorine compound, a lower unsaturated organic fluorine compound, or mixture thereof.

8. A process for producing a magnetic recording medium according to claim 6 or 7, wherein the phases of power supplied to the electrodes are shifted from each other.

9. A process for producing a magnetic recording medium according to claim 6 or 7, wherein the direct-current bias has a frequency of 1 kHz to 100 Hz.

10. A process for producing a magnetic recording medium according to claim 6 or 7, wherein the direct-current bias has a pulse width of 1 ns to 500 μs.

* * * * *